(12) United States Patent
Schaffer et al.

(10) Patent No.: US 11,972,191 B2
(45) Date of Patent: Apr. 30, 2024

(54) SYSTEM AND METHOD FOR PROVIDING ENHANCED NET PRUNING

(71) Applicant: Synopsys, Inc., Mountain View, CA (US)

(72) Inventors: Louis Schaffer, Durham, NC (US); Timmy Lin, Taipei (TW); Soo Han Choi, Mountain View, CA (US)

(73) Assignee: Synopsys, Inc., Sunnyvale, CA (US)

( * ) Notice: Subject to any disclaimer, the term of this patent is extended or adjusted under 35 U.S.C. 154(b) by 133 days.

(21) Appl. No.: 17/334,495

(22) Filed: May 28, 2021

(65) Prior Publication Data

US 2021/0374321 A1 Dec. 2, 2021

Related U.S. Application Data

(60) Provisional application No. 63/031,474, filed on May 28, 2020.

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC ...... G06F 30/39; G06F 30/398; G06F 30/367; G06F 30/392; G06F 30/394; G06F 30/327; G06F 30/3323; G06F 1/163; G06F 21/32; G06F 21/35; G06F 3/0346; G06F 3/016; G06F 3/017; G06F 2113/10; G06F 30/17; G06F 30/23; G06F 1/206; G06F 21/73; G06F 21/79; G06F 3/0383; G06F 3/04897; H01L 27/0688; H01L 23/49827; H01L 23/49838; H01L 2224/8013; H01L 2225/0651; H01L 2224/48; H01L 2225/06506; H01L 2027/11874; H01L 2027/11875; H01L 23/528; H01L 2225/06541; H01L 23/481; H01L 2924/13091; H01L 21/8221; H01L 2224/73253; H01L 27/0207; H01L 23/485; H01L 21/845; H01L 24/45; H01L 24/48; H01L 2225/06513; H01L 24/83; H01L 24/32; H01L 24/16; H01L 29/7843; H01L 23/5386; H01L 21/84; H01L 21/8252;

(Continued)

(56) References Cited

U.S. PATENT DOCUMENTS 10,115,663 B2 * 10/2018 Or-Bach ............. H01L 25/0657
10,649,026 B2 *  5/2020 Patterson ............ G01R 31/307
(Continued)

*Primary Examiner* — Binh C Tat
(74) *Attorney, Agent, or Firm* — Weaver Austin Villeneuve & Sampson LLP

(57) ABSTRACT

A method of pruning nets in a circuit design includes, in part, receiving data representative of net layers associated with the circuit design, and accessing a connect database associated with the circuit design. The connect database includes data representative of electrical connections associated with the circuit design. The method further includes, in part, determining whether a marker layer exists in the net layers, and pruning nets that are not connected to the marker layer if the marker layer is determined to exist. The marker layer, which is not stored in the connect database, designates a connection between at least a pair of nets in the circuit design.

19 Claims, 10 Drawing Sheets

(58) Field of Classification Search
CPC . H01L 2224/24146; H01L 2225/06544; H01L 23/552; H01L 23/538; H01L 23/5383; G03F 1/36; G03F 1/70; G03F 7/70658
USPC .................................................. 716/110–116
See application file for complete search history.

(56) References Cited

U.S. PATENT DOCUMENTS

| | | | |
|---|---|---|---|
| 2006/0265684 A1* | 11/2006 | Buehler | G06F 30/39 716/112 |
| 2016/0004808 A1* | 1/2016 | Feng | G06F 30/394 716/112 |
| 2017/0165790 A1* | 6/2017 | McCarthy | B22F 3/105 |
| 2018/0361510 A1* | 12/2018 | Stamp | B23K 26/34 |

* cited by examiner

SYSTEM AND METHOD FOR PROVIDING ENHANCED NET PRUNING

RELATED APPLICATION

The present application claims benefit under 35 USC 119(e) of U.S. Patent Application No. 63/031,474, filed May 28, 2020, the content of which is incorporated herein by reference in its entirety.

TECHNICAL FIELD

The present disclosure relates to an electronic design automation (EDA) system used in designing integrated circuits (ICs), and more particularly to a system and method for pruning of nets.

BACKGROUND

Due to their increasing complexity, integrated circuit designs have become more difficult to test and validate by software simulation. Design codes are commonly written in C++ language when using an electronic design automation (EDA) system. During the layout design process, designers/users apply a series of software commands to check for possible violations of layout and electrical design rules. An EDA validation system may be used to check for such violations. The EDA validation system may include a series of commands, referred to as runset commands, that check for design rule violation, such as when a polysilicon layer is considered as being too close to another polysilicon layer. The EDA validation system may also include an electrical connectivity database, referred to as a connect database, that includes information about all electrical connections in a design and how the electrical current flows in the design.

SUMMARY

A method of pruning nets in a circuit design, in accordance with one embodiment of the present disclosure includes, in part, receiving data representative of net layers associated with the circuit design, and accessing a connect database associated with the circuit design. The connect database includes data representative of electrical connections associated with the circuit design. The method further includes, in part, determining whether a marker layer exists in the net layers, and pruning nets that are not connected to the marker layer if the marker layer is determined to exist. The marker layer, which is not stored in the connect database, designates a connection between at least a pair of nets in the circuit design.

A non-transitory computer readable medium, in accordance with one embodiment of the present disclosure, includes stored instructions, which when executed by a processor, cause the processor to, in part, receive data representative of net layers associated with the circuit design, and access a connect database associated with the circuit design. The connect database includes data representative of electrical connections associated with the circuit design. The instruction further cause the processor, in part, to determine whether a marker layer exists in the net layers, and prune nets that are not connected to the marker layer if the marker layer is determined to exist. The marker layer, which is not stored in the connect database, designates a connection between at least a pair of nets in the circuit design.

A system includes a memory storing instructions, and a processor that is coupled with the memory and configured to execute the instructions. The instructions, in accordance with one embodiment of the present disclosure, when executed, cause the processor to, in part, receive data representative of net layers associated with the circuit design, and access a connect database associated with the circuit design. The connect database includes data representative of electrical connections associated with the circuit design. The instruction further cause the processor, in part, to determine whether a marker layer exists in the net layers, and prune nets that are not connected to the marker layer if the marker layer is determined to exist. The marker layer, which is not stored in the connect database, designates a connection between at least a pair of nets in the circuit design

BRIEF DESCRIPTION OF DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
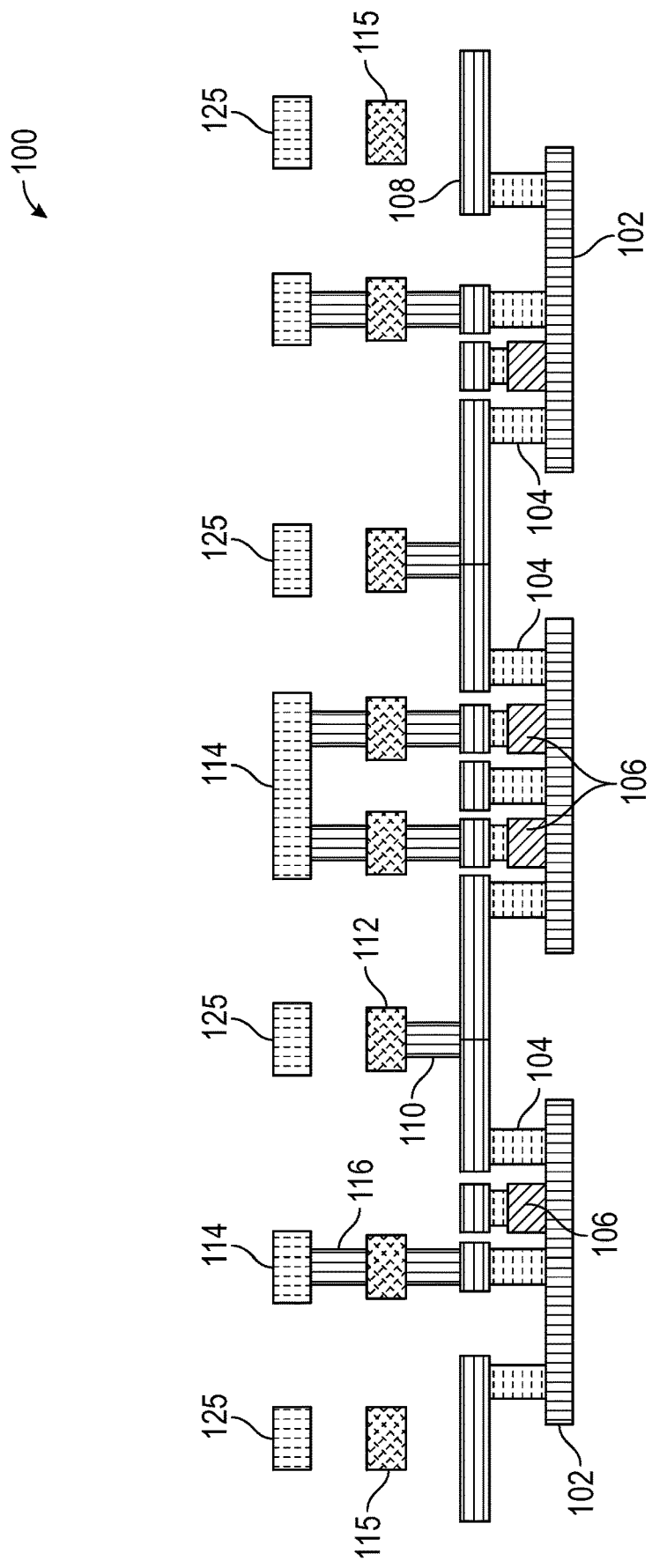
FIG. 1 is an exemplary schematic drawing of a cross-section of a semiconductor device.

As the number of transistors and metal layers in an integrated circuit increase, the time it takes to perform electrical connectivity analysis also increases. For example, checking for violations of the second metal layer rules may take an excessively long time when applied to nets that contain the first metal interconnect layer, polysilicon layer, and the active silicon active layer. Similarly, current EDA tools that check for violations of the rules between the third metal layer and nets containing the second metal layer, the first metal layer, polysilicon layer, and the active silicon layer are considered slow. As the number of interconnecting structures and metal layers continue to increase, a more efficient and faster process for checking of the electrical rule violations are needed.

An IC design database often includes a connect database that, in turn, includes electrical connectivity information about various device layers, such as active layers, metal layers, vias, and the like. A connect database describes layers that provide electrical connectivity when they overlap each other. This allows an electrical rule checker (ERC) to follow the paths of overlapping layers when evaluating ERC rules or building the netlist.

Metal lines typically have an end-of-line emission that may cause what is commonly referred to as antenna effect. Similarly, electro-magnetic field emission may occur between various metal lines receiving different voltages. Therefore, an EDA tool performing connectivity analysis should also check for potential antenna effects, and for voltage difference across different metal lines.

Below is an example of an EDA validation system (e.g., IC Validator©) code that uses the runset command net_select to identify nets that are connected to the third metal layer, designated below as METAL3. The connect database provides description about how layers overlap to create paths for current flow. The ERC command, for example, will see and follow the path shown below and see a net connected to METAL3. The ERC command knows this because of the overlapping descriptions in parenthesis.

```
V0=>METAL1=>V1=>METAL2=>V2=>METAL2
connect_mt3 = connect({
   {{ METAL0, POLY }, VP },
   {{ METAL1, METAL0 }, V0 },
   {{ METAL2, METAL1 }, V1 },
   {{ METAL3, METAL2 }, V2 ,
   {{ nsd, }, diff_con },
   {{ ngate, pgate, }, POLY },
   {{ NWELL }, ntap } }
});
net_select( connect_sequence=connect_mt3, connected_to_any=
{METAL3},
output_from_layers={METAL3});
```

Below is another example of an EDA validation system (e.g., IC Validator©) code that also uses the runset command net_select to identify nets that are connected to third metal layer, shown below as M3. However, the code below also includes the runset command same_net_psd that causes a search for all PMOS transistors that are diode-connected with a source-to-drain distance of less than 0.014 micrometer. The code results in marking the diode connection as a marker layer. Marker layers are not present in a circuit design's associated connect database otherwise they would result in the designated connection to be applied globally.

```
connect_mt3 = connect({
   {{ METAL0, POLY }, VP },
   {{ METAL1, METAL0 }, V0 },
   {{ METAL2, METAL1 }, V1 },
   {{ METAL3, METAL2 }, V2 },
   {{ nsd, }, diff con 1,
   {{ ngate, pgate, }, POLY },
   {{ NWELL }, ntap } }
});
same_net_psd = external1( psd, <= 0.014, connectivity = SAME_NET,
connect_sequence=connect_mt3, direction = HORIZONTAL);
net_select( connect_sequence=connect_mt3, connected_to_any={M3},
output_from_layers={M3});
net_select( connect_sequence=connect_mt3, connected_to_any={psd},
output_from_layers={psd});
```

In the above example, the code:
same_net_psd=external1(psd, <=0.014, connectivity=SAME_NET, connect_sequence=connect_mt3, direction=HORIZONTAL);
designates (marks) the diode connection as a marker layer.

In accordance with one embodiment of the present disclosure, pruning of the nets is performed in a manner that causes the efficiency and speed with which electrical rules violations are performed to increase substantially. In one example, embodiments of the present disclosure achieve a runtime performance advantage of at least 30% when checking for potential violations of the electrical rules. To achieve this, the following two criteria are used to determine the nets that are maintained and not pruned. In accordance with the first criterion, all layers that are connected to one or more designated in a connect database are maintained and, therefore, are not pruned. In accordance with the second criterion, the marker layers as well as all layers that interact, as described further below, with the marker layers are maintained, and therefore are not pruned. All other nets that are not maintained based on the above two criteria are pruned.

FIG. 1 is an exemplary schematic drawing of a cross-section of a semiconductor device 100 shown as including an active layer 102, contact layer 104, polysilicon layer 106, first layer metal 108, second layer metal 112, first via layer 110, third layer metal 114, and second via layer 116. Also shown in FIG. 1 are second layer metal fill 115, and third layer metal fill 125.

Figure 2:
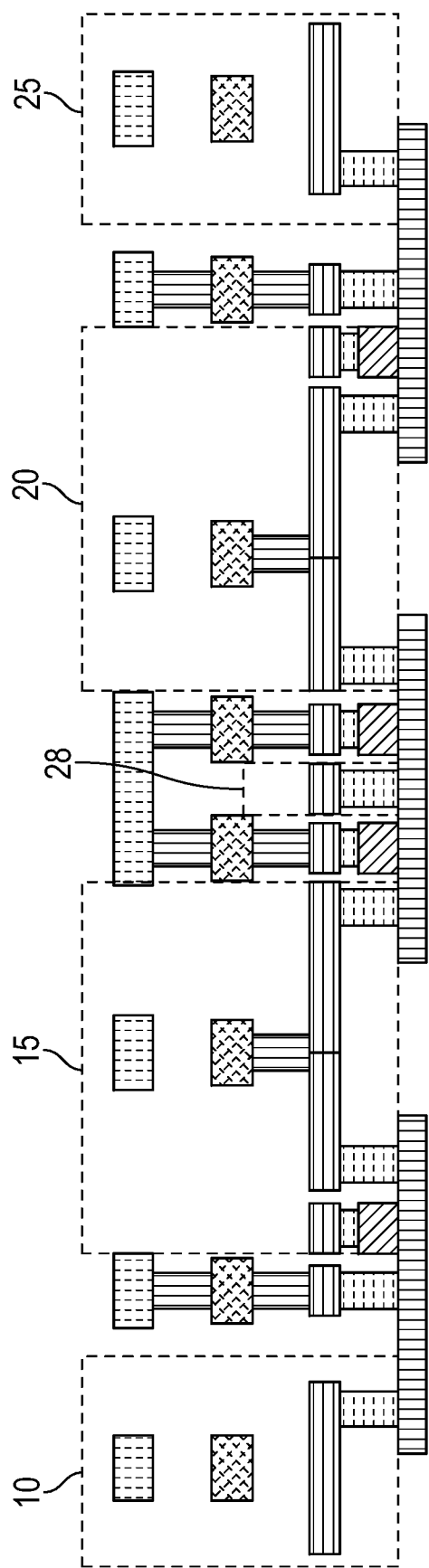
FIG. 2 shows the device of FIG. 1 after the layers not connected to the third metal layer of the device are pruned.

FIG. 2 shows device 100 after the layers not connected to the third metal layer of the device shown in FIG. 1 are removed. The removed nets are shown within dashed lines 10, 15, 20, 25, and 28. Below is an example of an EDA validation system code to effectuate such removal. The function prune_nets will prune nets not connected to METAL3 connect_db1=prune_nets (connect_db, {{prune=NOT_CONNECTED_TO, connected_layer=METAL3}})

Figure 3:
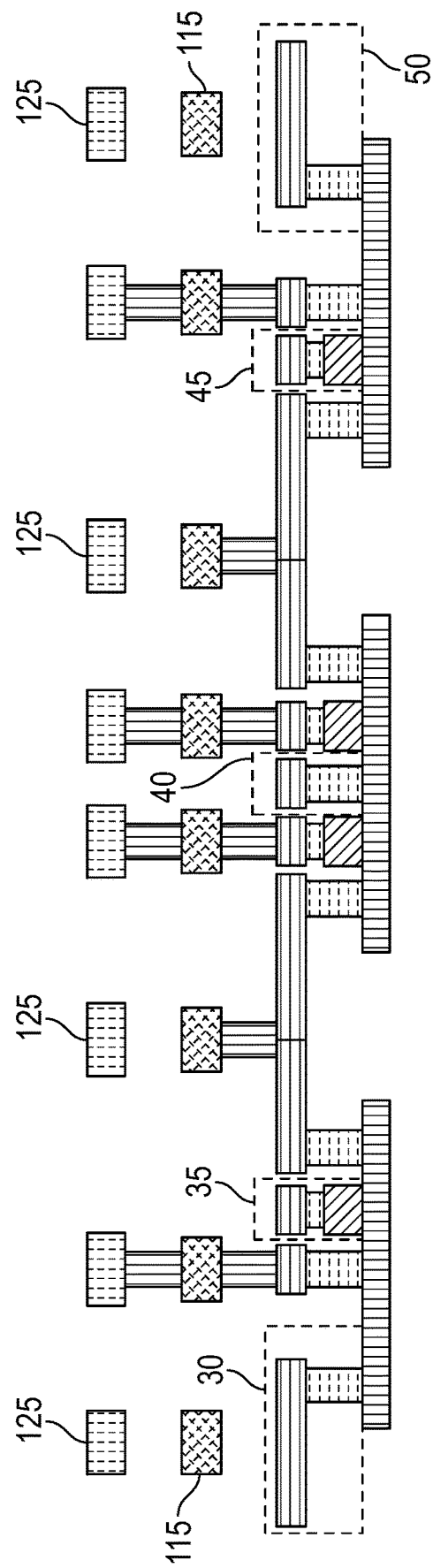
FIG. 3 shows the device of FIG. 1 after the layers not connected to the second metal layer of the device are pruned.

FIG. 3 shows device 100 after the layers not connected to the second metal layer of the device shown in FIG. 1 are removed. The removed nets are shown within dashed lines 30, 35, 40, 45, and 50. Below is an example of an EDA validation system code to effectuate such removal. The function prune_nets will prune all nets not connected to METAL2.
connect_db1=prune_nets (connect_db, {{prune=NOT_CONNECTED_TO, connected_layer=METAL2}})

Figure 4:
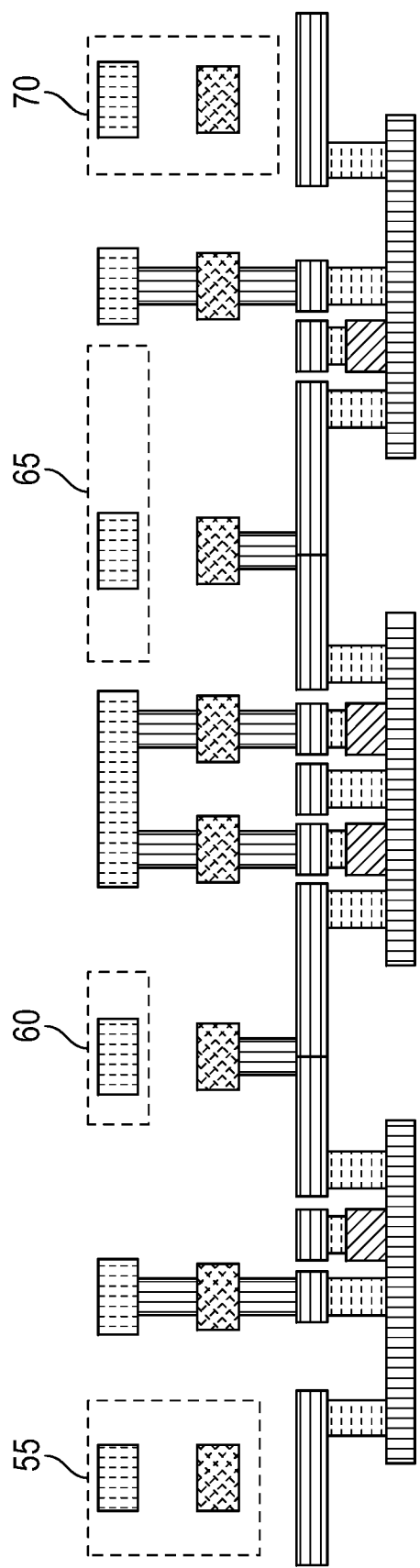
FIG. 4 shows the device of FIG. 1 after the metal fill layers not connected to the active layer of the device are pruned.

FIG. 4 shows device 100 after the metal fill layers not connected to the active layer of the device shown in FIG. 1 are removed. The metal fill layers that are removed are shown within dashed lines 55, 60, 65 and 75. Below is an example of an EDA validation system code to effectuate such removal: The function prune nets will prune all nets not connected to active devices.
connect_db1=prune_nets (connect_db, {{prune=NOT_CONNECTED_TO, connected_layer=active_device}})

Figure 5A:
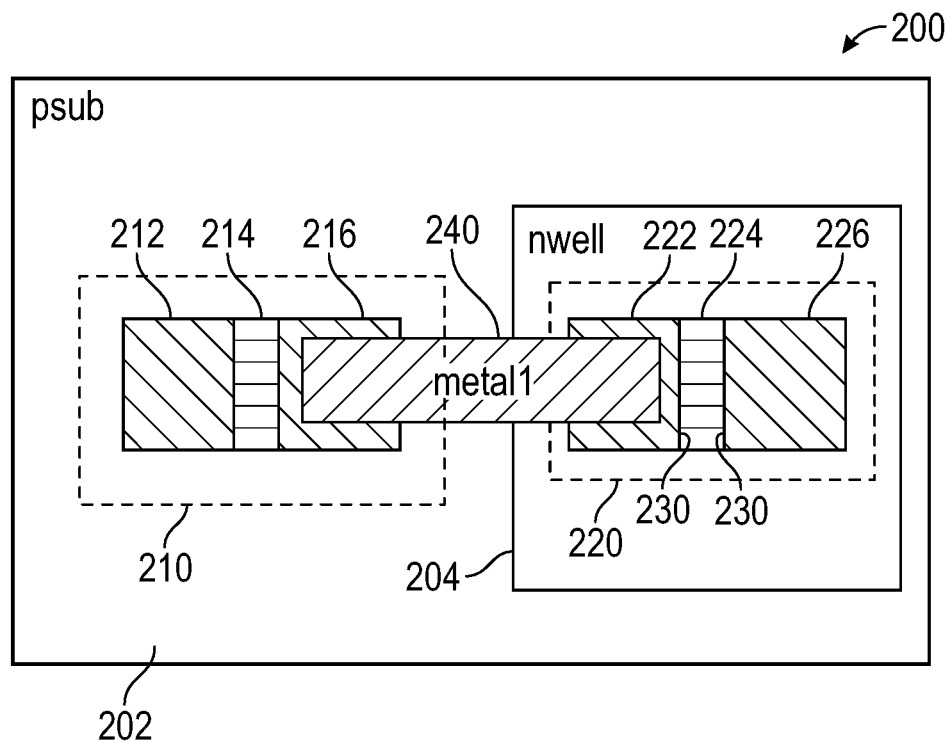
FIG. 5A is a layout view of a PMOS transistor and an NMOS transistor.
Figure 5B:
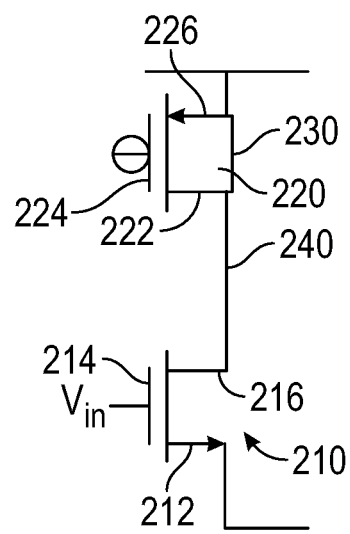
FIG. 5B is a transistor schematic diagram of the PMOS and NMOS transistors of FIG. 5A.

FIG. 5A is a layout view of a PMOS transistor 220 and an NMOS transistor 210. The PMOS transistor 220 is formed in Nwell 204 and is shown as including drain 226, gate 224 and source 222. Nwell 204 is shown as having been formed in p-type substrate 202. The NMOS transistor 210 is shown as including drain 216, gate 214 and source 212. The drain 216 of the NMOS transistor 210 and the drain 222 of the PMOS transistor 220 are shown as being connected to one another via first layer metal 240. The edges of the source 226 and drain 222 of the PMOS transistor 220 are shown as being marked using marker layer 230 to indicate that the source 226 and the drain 222 of the PMOS transistor 220 are to be subsequently connected to one another to form a diode-connected PMOS transistor. FIG. 5B is a transistor schematic diagram of the NMOS transistor 210 and PMOS transistor 220. Also shown in FIG. 5B is the marker layer 230 indicating that the source 226 and the drain 222 of the PMOS transistor 220 are to be connected to one another.

As described above, a marker layer, such as marker layer 230 shown in FIGS. 5A and 5B, is not present in the connect database and is used to indicate that the net layers marked by the marker layer are to be connected to one another. As was also described above, any net not connected to a marker layer or not interacting with a marker layer is pruned, in accordance with one embodiment of the present disclosure. A net is defined herein as not interacting with another layer if the net does not overlap with the other layer either capacitively or inductively.

Figure 6:
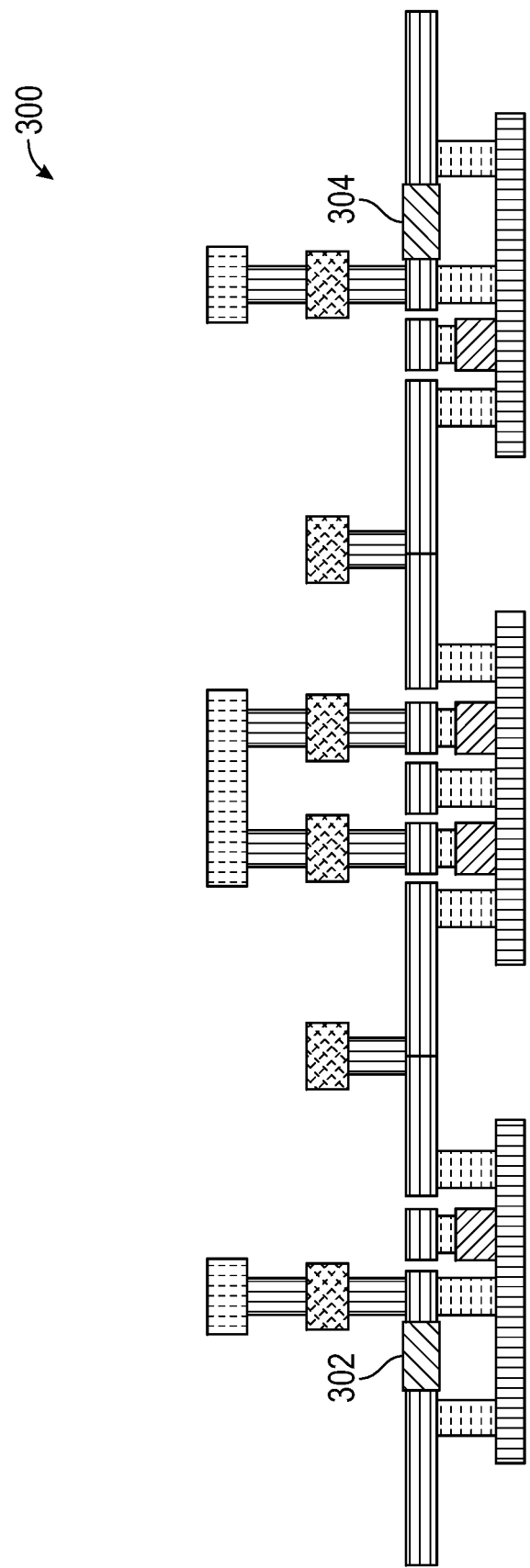
FIG. 6 is an exemplary schematic drawing of a cross-section of a semiconductor device that includes marker layers, in accordance with one embodiment of the present disclosure.
Figure 7:
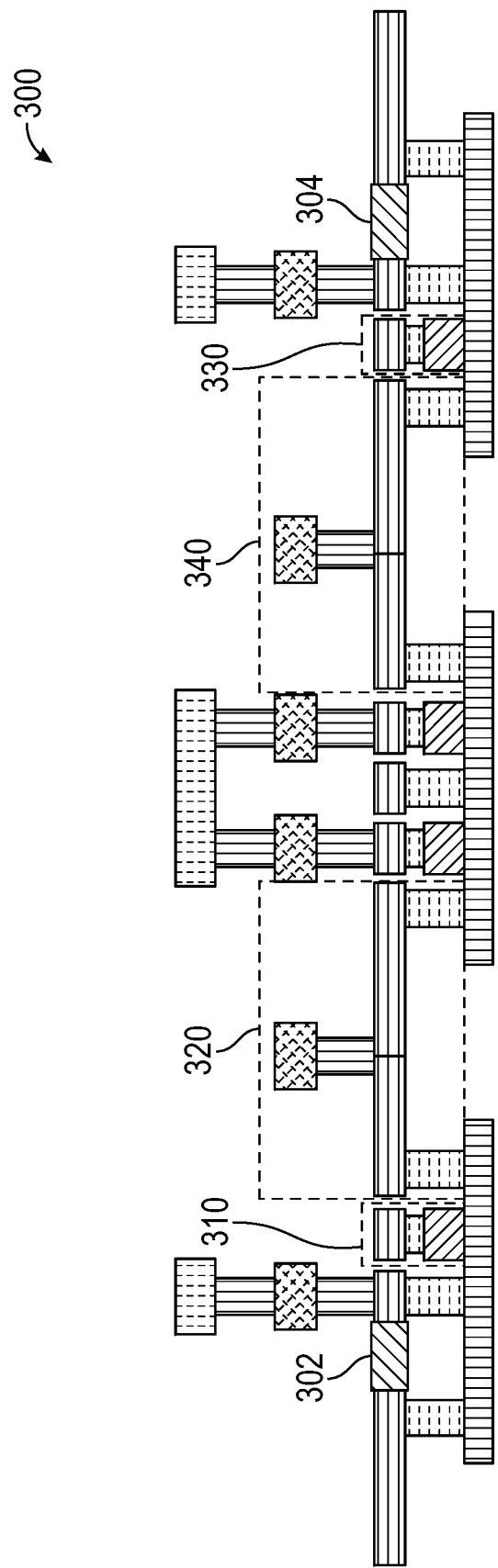
FIG. 7 shows the device of FIG. 6 after pruning a number of net layers of the device, in accordance with one embodiment of the present disclosure.

FIG. 6 is an exemplary schematic drawing of a cross-section of a semiconductor device 300. Semiconductor device 300 is similar to semiconductor device 100, except that semiconductor device 300 includes marker layers 302 and 304. For clarity, second layer metal fill 115, and third layer metal fill 125 are not shown in FIG. 6. FIG. 7 shows device 300 after (i) the net layers not connected to the third metal layer, and/or ii) net layers not connected to or interacting with marker layers 302 and 304 are pruned. Because net layers collectively identified as 310, 320, 330 and 340 are not connected to the third metal layer and do not interact with marker layers 302, 304, net layers in 310, 320, 330 and 340 are pruned. Below is an exemplary EDA validation system code that results in the removal of the net layers not connected to the third metal layer, and/or ii) net layers not connected to or interacting with the marker layers connecting the source and drain terminals of PMOS transistors:

```
connect_db1 = prune_nets (connect_db, {
    {prune = NOT_CONNECTED_TO, connected_layer = METAL3}
    {prune = NOT_CONNECTED_TO, connected_layer = active_device,
    marker_layer = shorted_psd_diode}})
```

Figure 8:
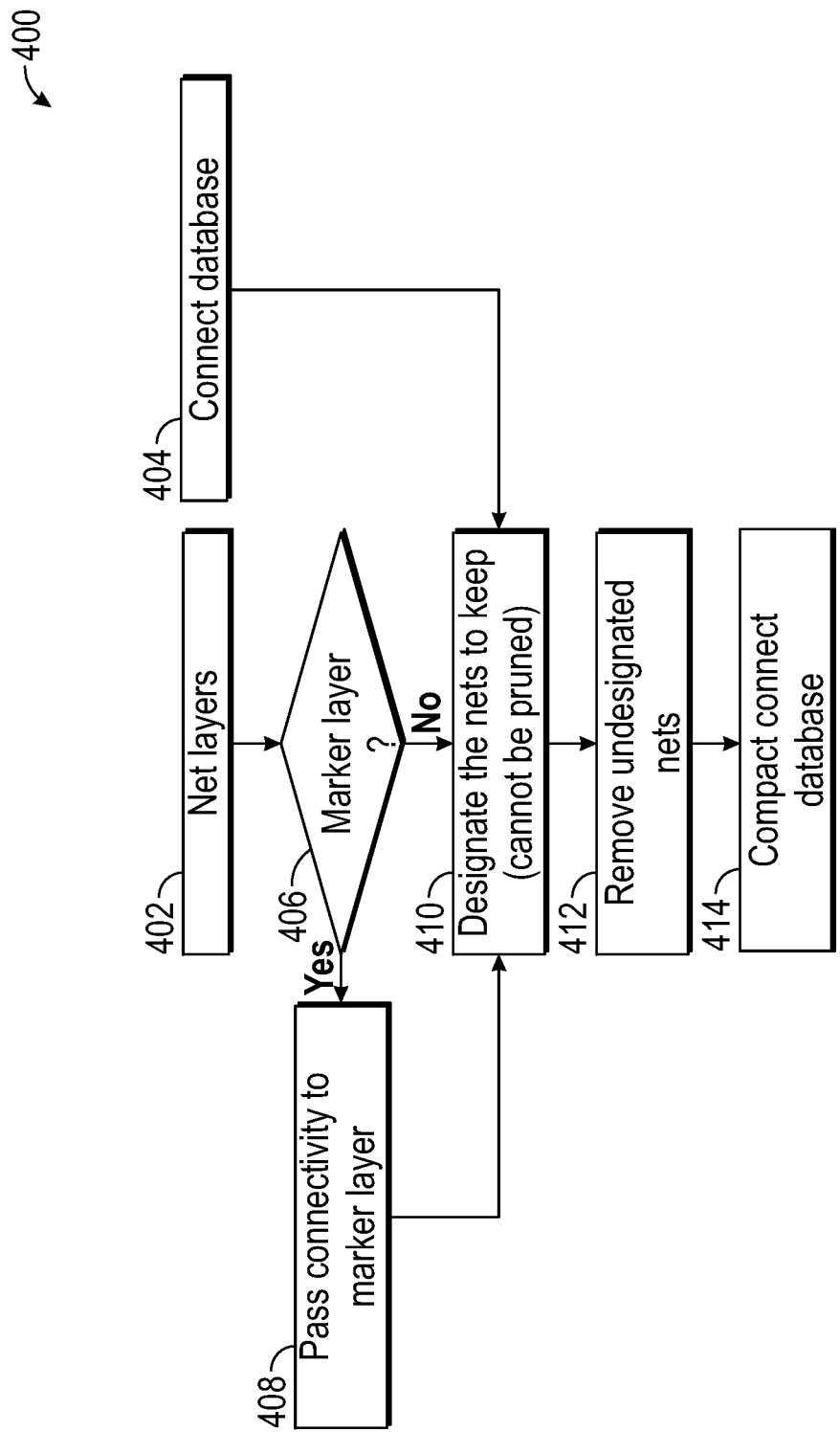
FIG. 8 shows a flowchart for pruning of nets in accordance with one embodiment of the present disclosure.
Figure 9:
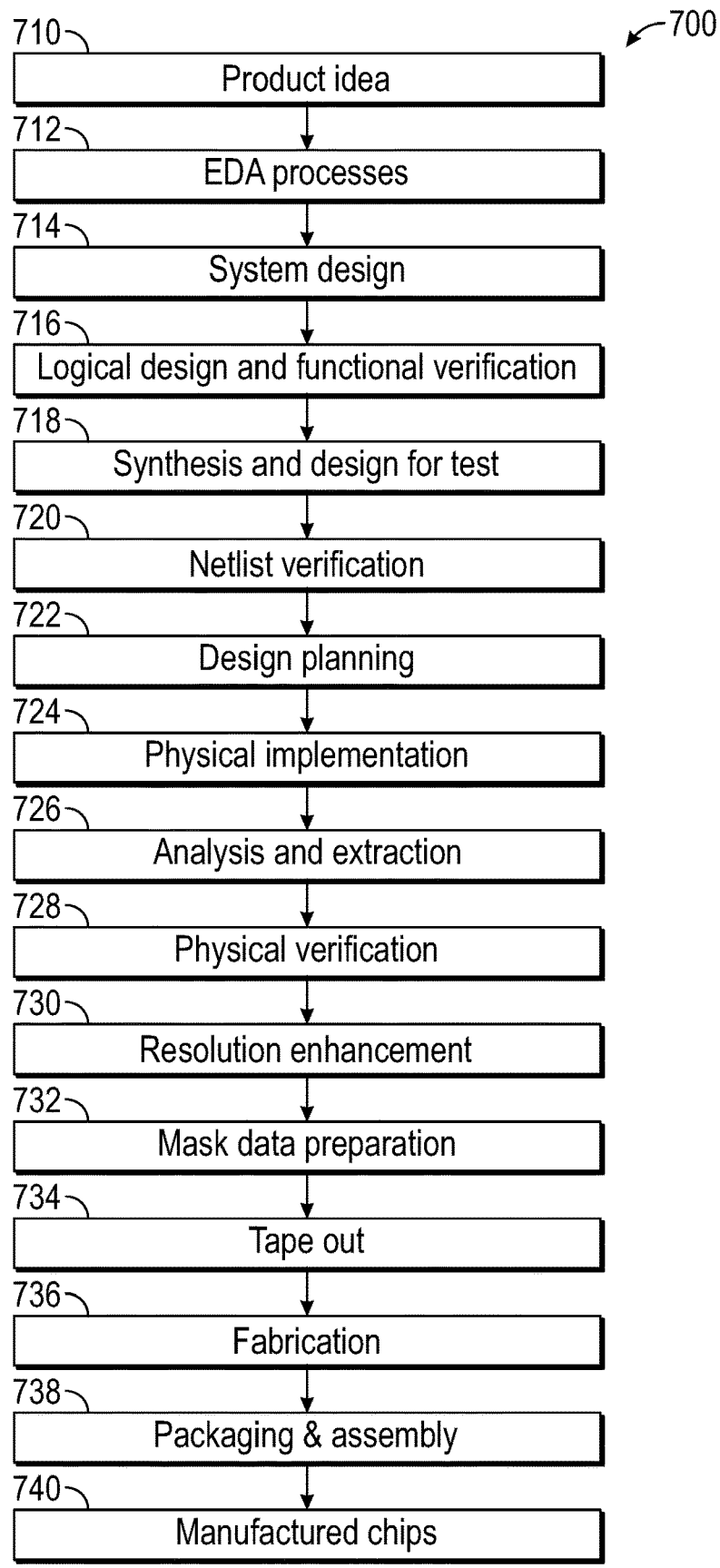
FIG. 9 is a flowchart of various processes used during the design and manufacture of an integrated circuit, in accordance with some embodiments of the present disclosure.

FIG. 8 shows a flowchart 400 for pruning of nets in accordance with one embodiment of the present disclosure. At 402, information about the net layers associated with a circuit design are received. At 404, a connect database associated with the circuit design is received. At 406, a determination is made as to whether one or more marker layers exist in the circuit design. If at 406, no marker layer is determined to exist, then at 410, layers in the connect database that are not to be removed, based on one or more specified commands, are identified and designated as such. If at 406, one or more marker layers are determined to exist, then at 408, the connectivity is passed to marker layer at which point nets not connected to or not interacting with the marker layers are removed, subsequent to which the process moves to 410. At 412, all nets that are not designated for removal in the connect database are kept and the remaining nets are removed. At 414, a compact connect database is created, that may be used to check, for example, for antenna effects FIG. 9 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower level representation of a design adds more useful detail into the design description, for example, more details for the modules that include the description. The lower levels representation of a design may be generated by a computer, derived from a design library, or created by another design automation process. An example of a specification language representative of a lower level description of a design is SPICE, which is used for detailed descriptions of circuits with many analog components. Descriptions at each level of representation are enabled for use by the corresponding tools of that layer (e.g., a formal verification tool). A design process may use a sequence depicted in FIG. 9. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 10) may be used to store the programs and data structures that are used by some or all of the EDA products described herein, and products used for development of cells for the library and for physical and logical design that use the library.

Figure 10:
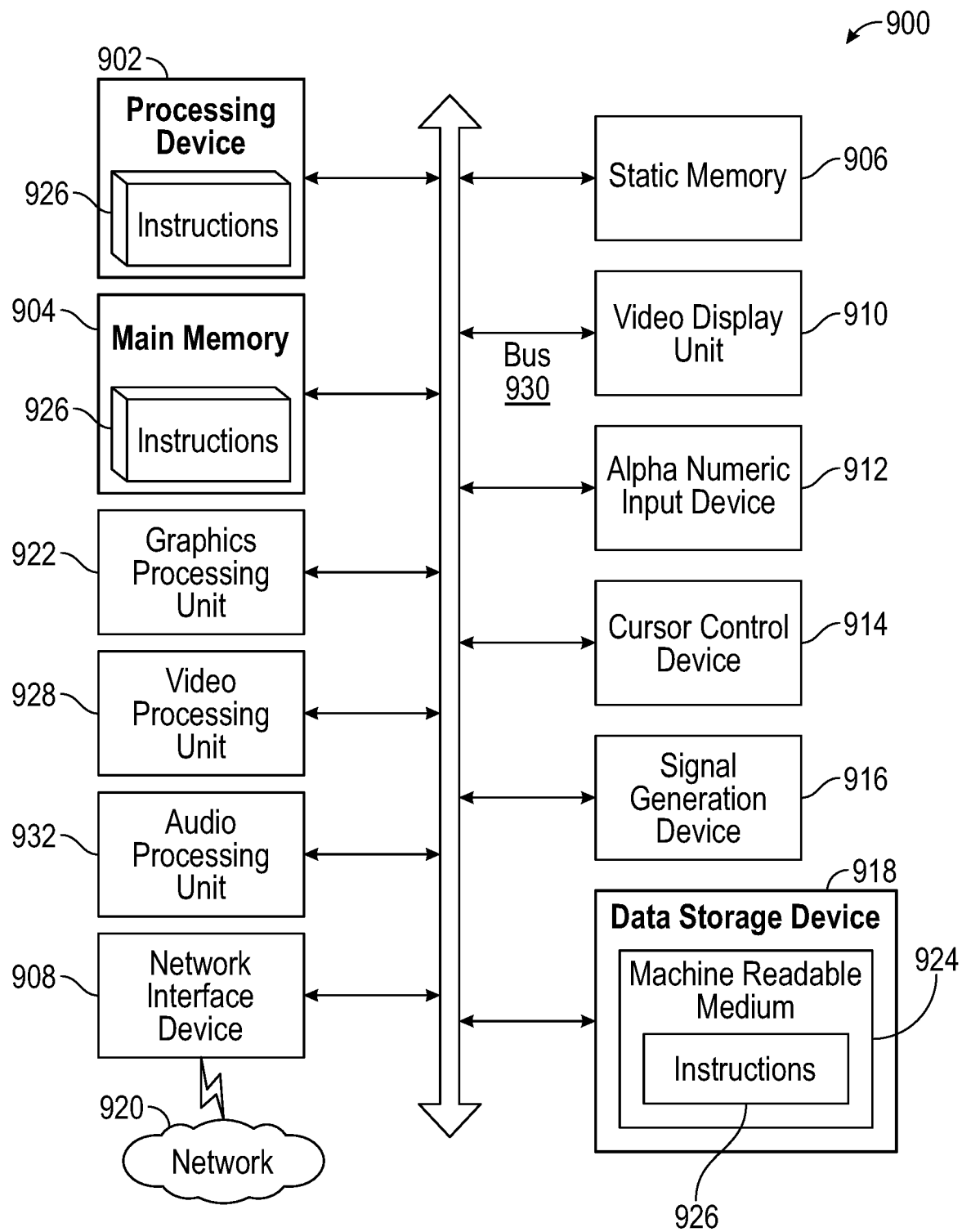
FIG. 10 is an example of a computer system in which embodiments of the present disclosure may operate.

FIG. 10 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of pruning nets in a circuit design, the method comprising:
   receiving data representative of net layers associated with the circuit design;
   accessing, by a processor, a connect database associated with the circuit design, the connect database comprising data representative of electrical connections associated with the circuit design;
   determining whether a marker layer exists in the net layers, wherein the marker layer designates a connection between a first net and a second net in the circuit design, wherein the marker layer is not stored in the connect database; and
   removing nets that are not connected to the marker layer if the marker layer is determined to exist.

2. The method of claim 1 further comprising:
   removing nets that are not capacitively coupled to the marker layer if the marker layer is determined to exist.

3. The method of claim 2 further comprising:
   removing nets that are not inductively coupled to the marker layer if the marker layer is determined to exist.

4. The method of claim 3 further comprising:
   removing nets that are not connected to a designated layer in the connect database.

5. The method of claim 4 wherein the designated layer is a metal layer.

6. The method of claim 5 wherein said net layers comprise a plurality of active layers and metal layers.

7. The method of claim 1 wherein said marker layer designates a diode connection associated with a transistor disposed in the circuit design.

8. A non-transitory computer readable medium comprising stored instructions, which when executed by a processor, cause the processor to:
   receive data representative of net layers associated with the circuit design;
   access a connect database associated with the circuit design, the connect database comprising data representative of electrical connections associated with the circuit design;
   determine whether a marker layer exists in the net layers, wherein the marker layer designates a connection between a first net and a second net, and wherein the marker layer is not stored in the connect database;
   remove nets that are not connected to the marker layer if the marker layer is determined to exist; and
   remove nets that are not connected to a designated layer in the connect database.

9. The non-transitory computer readable medium of claim 8 wherein the stored instructions further cause the processor to:
   remove nets that are not capacitively coupled to the marker layer if the marker layer is determined to exist.

10. The non-transitory computer readable medium of claim 9 wherein the stored instructions further cause the processor to:
    remove nets that are not inductively coupled to the marker layer if the marker layer is determined to exist.

11. The non-transitory computer readable medium of claim 8 wherein the designated layer is a metal layer.

12. The non-transitory computer readable medium of claim 11 wherein the net layers comprise a plurality of active layers and metal layers.

13. The non-transitory computer readable medium of claim 8 wherein the marker layer designates a diode connection associated with a transistor disposed in the circuit design.

14. A system comprising:
- a memory storing instructions; and
- a processor, coupled with the memory and to execute the instructions, the instructions when executed causing the processor to:
  - receive data representative of net layers associated with the circuit design;
  - access a connect database associated with the circuit design, the connect database comprising data representative of electrical connections associated with the circuit design;
  - determine whether a marker layer exists in the net layers, wherein the marker layer designates a connection between a first net and a second net, and wherein the marker layer is not stored in the connect database; and
  - nets that are not connected to the marker layer if the marker layer is determined to exist.

15. The system of claim 14 wherein the instructions further cause the processor to:
- remove nets that are not capacitively coupled to the marker layer if the marker layer is determined to exist.

16. The system of claim 15 wherein the instructions further cause the processor to:
- remove nets that are not inductively coupled to the marker layer if the marker layer is determined to exist.

17. The system of claim 14 wherein the instructions further cause the processor to:
- remove nets that are not connected to a designated layer in the connect database.

18. The system of claim 14 wherein the designated layer is a metal layer.

19. The system of claim 14 wherein the marker layer designates a diode connection associated with a transistor disposed in the circuit design.

* * * * *